(12) United States Patent
Lee

(10) Patent No.: US 7,550,363 B2
(45) Date of Patent: Jun. 23, 2009

(54) METHOD OF FABRICATING A SEMICONDUCTOR DEVICE HAVING FIRST AND SECOND TRENCHES USING NON-CONCURRENTLY FORMED HARD MASK PATTERNS

(75) Inventor: Wook-Hyoung Lee, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/493,004

(22) Filed: Jul. 26, 2006

(65) Prior Publication Data
US 2007/0026633 A1 Feb. 1, 2007

(30) Foreign Application Priority Data
Aug. 1, 2005 (KR) .................. 10-2005-0070322

(51) Int. Cl.
*H01L 21/76* (2006.01)
(52) U.S. Cl. ................ 438/424; 438/427; 257/E21.683
(58) Field of Classification Search ................ 438/296, 438/297, 400, 424, 427, 435, 439; 257/374, 257/506, E21.545, E21.546, E21.548, E21.549, 257/E21.55, E21.683
See application file for complete search history.

(56) References Cited

U.S. PATENT DOCUMENTS

| | | | |
|---|---|---|---|
| 6,626,968 B2* | 9/2003 | Park et al. ..................... | 51/309 |
| 6,756,654 B2* | 6/2004 | Heo et al. ..................... | 257/510 |
| 6,995,095 B2* | 2/2006 | Yu ............................... | 438/750 |
| 7,244,680 B2* | 7/2007 | Yu ............................... | 438/700 |
| 2002/0134754 A1* | 9/2002 | Kim ............................. | 216/39 |
| 2004/0092115 A1* | 5/2004 | Hsieh et al. ................. | 438/694 |
| 2005/0009293 A1* | 1/2005 | Kim et al. ................... | 438/424 |
| 2006/0043455 A1* | 3/2006 | Batra et al. ................. | 257/314 |
| 2006/0270181 A1* | 11/2006 | Sandhu et al. .............. | 438/424 |

FOREIGN PATENT DOCUMENTS

| | | |
|---|---|---|
| JP | 315442 | 11/1993 |
| JP | 11-054499 | 2/1999 |
| KR | 100281272 | 11/2000 |
| KR | 1020020074003 | 9/2002 |
| KR | 1020030059465 | 7/2003 |
| KR | 1020040060474 A | 7/2004 |
| KR | 1020050014221 A | 2/2005 |

* cited by examiner

*Primary Examiner*—Khiem D Nguyen
(74) *Attorney, Agent, or Firm*—Volentine & Whitt, PLLC

(57) ABSTRACT

A semiconductor device comprising a trench device isolation layer and a method for fabricating the semiconductor device are disclosed. The method comprises forming a plurality of first trenches on a first region of a semiconductor substrate, filling the first trenches with a first insulation material to form first device isolation layers, forming a plurality of second trenches on a second region of the semiconductor substrate, and filling the second trenches with a second insulation material different from the first insulation material to form second device isolation layers, wherein the first trenches and the second trenches are formed using different respective processes.

22 Claims, 14 Drawing Sheets

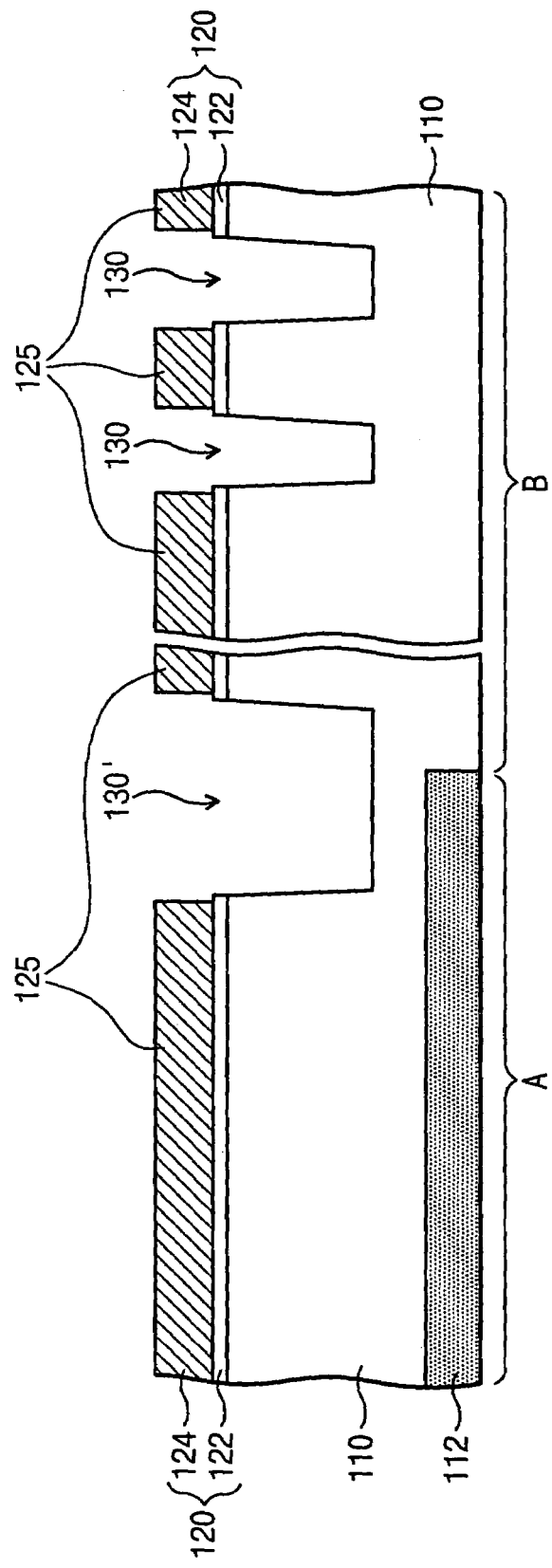

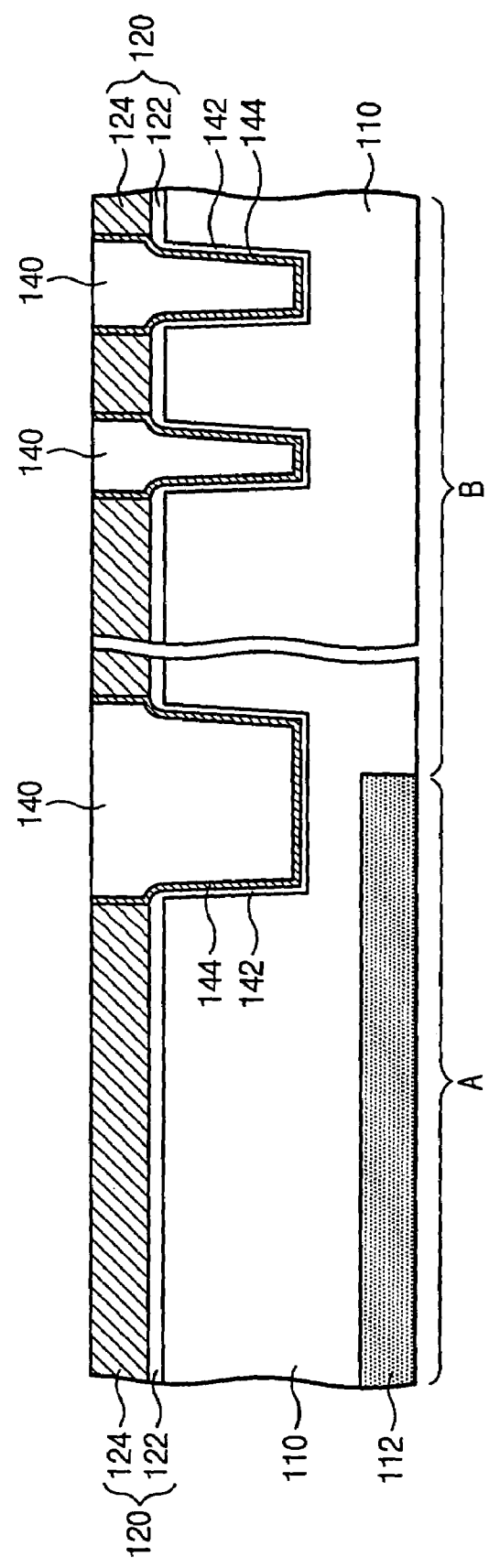

METHOD OF FABRICATING A SEMICONDUCTOR DEVICE HAVING FIRST AND SECOND TRENCHES USING NON-CONCURRENTLY FORMED HARD MASK PATTERNS

BACKGROUND OF THE INVENTION

1. Field of the Invention

Embodiments of the invention relate to a semiconductor device and a method of fabricating the semiconductor device. In particular, embodiments of the invention relate to a semiconductor device comprising a device isolation layer disposed in a trench and a method of fabricating the semiconductor device.

This application claims priority to Korean Patent Application No. 10-2005-0070322, filed on Aug. 1, 2005, the subject matter of which is hereby incorporated by reference in its entirety.

2. Description of Related Art

As semiconductor devices become more highly integrated, the size of a unit cell array in an individual semiconductor device decreases, requiring a reduction in the size of device isolation layers in the unit cell array. Deep and narrow device isolation layers can be formed in a substrate when using a trench isolation process, unlike when using conventional local oxidation of silicon (LOCOS) device isolation techniques. Trench isolation processes are used widely in the fabrication of highly integrated semiconductor devices.

Trenches formed in a cell array region of a semiconductor memory device may have different depths than trenches formed in a peripheral circuit region of a semiconductor memory device. However, properly forming device isolation layers in the trenches may be more problematic when the depths of the trenches are different. In addition, when the aspect ratio of a trench is relatively great, it is more difficult to fill the inside of the trench with a device isolation layer without forming a void in the device isolation layer.

Figure (FIG.) 1A is a plan view illustrating device isolation layers formed in a cell array region A and a peripheral circuit B of a conventional flash memory device. FIG. 1B is a cross-sectional view taken along a line I-I' of FIG. 1A and illustrating device isolation layers formed using a conventional method. FIG. 1C is a cross-sectional view taken along line I-I' of FIG. 1A and illustrating trenches in which a selective etching (i.e., pull-back) process has been performed on a silicon nitride layer.

Referring to FIGS. 1A and 1B, line-type active regions having uniform widths and uniform distances that are respectively disposed under portions of hard mask pattern 20 are formed in cell array region A of the flash memory device illustrated in FIGS. 1A and 1B. Also, device isolation layers 40a having uniform widths and uniform distances are formed in trenches having uniform depths. However, peripheral circuit region B comprises a plurality of trenches having different shapes, and the layout of device isolation layers 40b, 40c, and 40d in peripheral circuit region B (and a portion of cell array region A) is more complicated than the layout of device isolation layers 40a formed entirely in cell array region A. The aspect ratio of a selected trench in peripheral circuit region B may be larger than the aspect ratio of a selected trench in cell array region A. Additionally, some or all of the trenches disposed in peripheral circuit region B may have different widths and/or depths than one another.

Referring to FIG. 1B, when forming the trenches, a hard mask pattern 20 is formed on a semiconductor substrate 10. Hard mask pattern 20 comprises a pad oxide pattern 22 and a silicon nitride pattern 24 stacked sequentially. Trenches having various aspect ratios are then formed in semiconductor substrate 10 using hard mask pattern 20 as an etching mask. The trenches are then filled with an insulation material. Next, a chemical mechanical polishing (CMP) is performed to expose hard mask pattern 20 and form device isolation layers 40a, 40b, 40c, and 40d.

A void 11 may be formed in a specific region of device isolation layers 40b, 40c, and 40d of peripheral region B (e.g., in a device isolation layer having a relatively large aspect ratio, or in a region where trenches cross). A void 11 may occur because all of the trenches are filled with the same insulation material without regard to the different shapes and aspect ratios of the trenches. Moreover, when an insulation material that is only useful for filling trenches formed in cell array region A is used to fill the trenches formed in peripheral circuit region B, voids 11 will unavoidably be formed in the trenches of peripheral circuit region B that have relatively large aspect ratios. Thus, difficulties arise when the trenches of cell array region A and the trenches of peripheral circuit region B are filled simultaneously.

Alternatively, a device isolation process for improving the gap-filling characteristics of the trenches formed in peripheral circuit region B may be performed. That is, a selective etching (i.e., a pull-back) process may be performed on silicon nitride layer 24 (see FIG. 1C). Referring to FIG. 1C, a hard mask pattern 20 comprising a pad oxide pattern 22 and a silicon nitride pattern 24 stacked sequentially is formed on a semiconductor substrate 10, and trenches having various aspect ratios are formed in semiconductor substrate 10 using hard mask pattern 20 as an etching mask. Then, semiconductor substrate 10 is put in a solution adapted to selectively etch silicon nitride pattern 24, which comprises a plurality of segments 25. Thus, sidewalls of segments 25 are etched. Therefore, the widths of segments 25 of hard mask pattern 20 may be reduced. Accordingly, the gap-filling characteristics of the trenches of peripheral circuit region B can be improved. However, the preceding process may unavoidably lead to variations in the width of the active region. In particular, the width of the active region is not maintained uniformly in a memory device comprising line-type active regions in cell array region A. Thus, variation of a threshold voltage in the cell transistor increases.

SUMMARY OF THE INVENTION

Embodiments of the invention provide a method for fabricating a semiconductor device in which trenches in a first region of a substrate and trenches in a second region of a substrate are formed using different respective processes, and in which a smaller void or no void is generated during the formation of trench device isolation layers. Embodiments of the invention also provide a semiconductor device comprising a trench device isolation layer having either a smaller void or no void.

In one embodiment, the invention provides a method for fabricating a semiconductor device that comprises forming a plurality of first trenches on a first region of a semiconductor substrate, filling the first trenches with a first insulation material to form first device isolation layers, forming a plurality of second trenches on a second region of the semiconductor substrate, and filling the second trenches with a second insulation material different from the first insulation material to form second device isolation layers, wherein the first trenches and the second trenches are formed using different respective processes.

In another embodiment, the invention provides a semiconductor device comprising a semiconductor substrate comprising a first region and a second region; a plurality of first trenches formed in the first region, wherein one trench of the first trenches has at least one of a different width and a different depth than another trench of the first trenches; and first device isolation layers respectively disposed in the first trenches to fill the first trenches, wherein the first device isolation layers are formed from a first insulation material. The semiconductor device further comprises a plurality of second trenches formed in the second region, wherein each of the second trenches has substantially the same width and substantially the same depth; and second device isolation layers respectively disposed in the second trenches to fill the second trenches, wherein the second device isolation layers are formed from a second insulation material different from the first insulation material.

BRIEF DESCRIPTION OF THE DRAWINGS

Embodiments of the invention will be described herein with reference to the accompanying drawings, in which like reference symbols refer to like elements throughout. In addition, for the purpose of clarity, the thicknesses of films and regions in the drawings may not be drawn to scale. In the drawings.

DESCRIPTION OF EMBODIMENTS

Figure 1A:
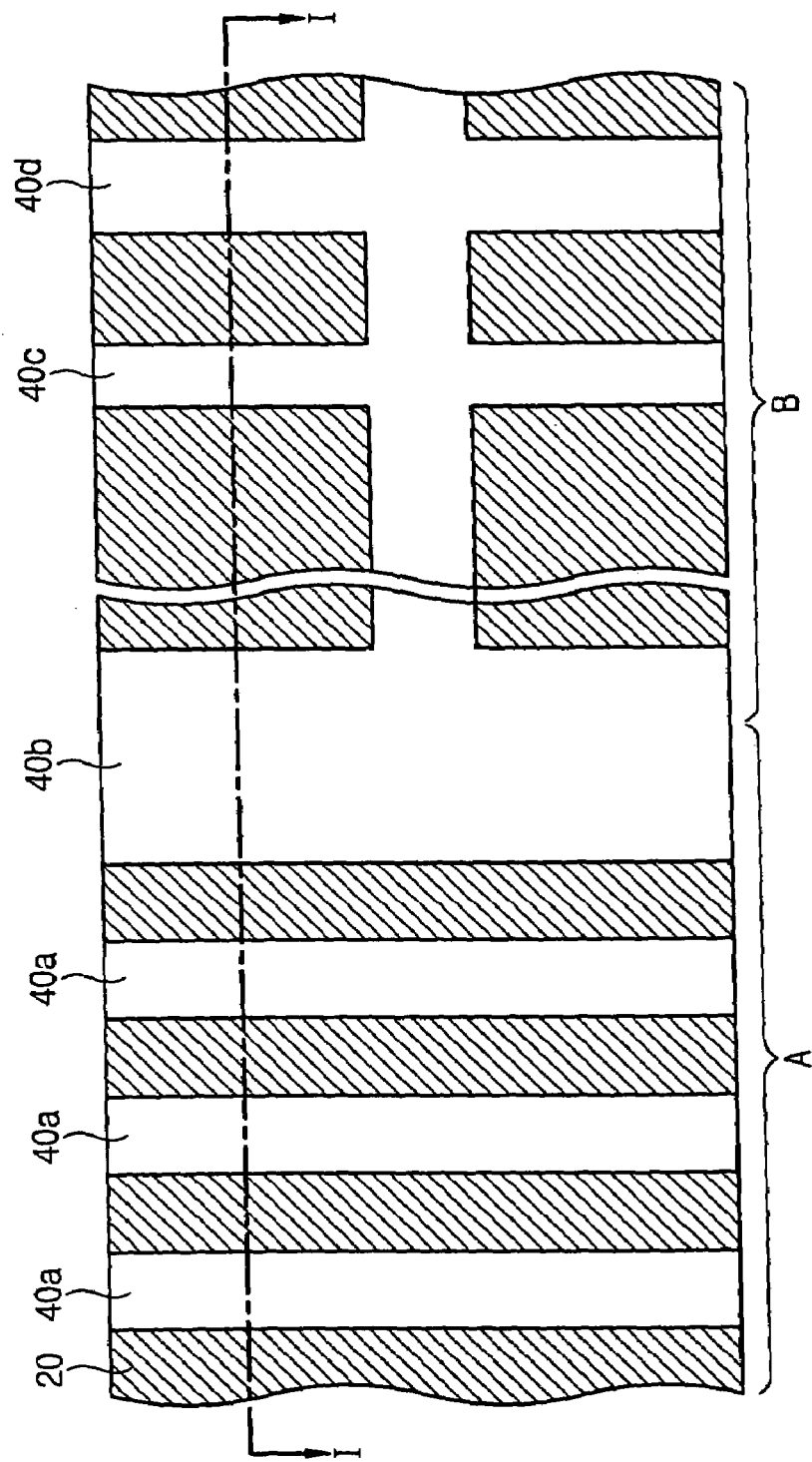
FIG. 1A is a plan view illustrating device isolation layers formed in a cell array region and a peripheral circuit of a conventional flash memory device.
Figure 1B:
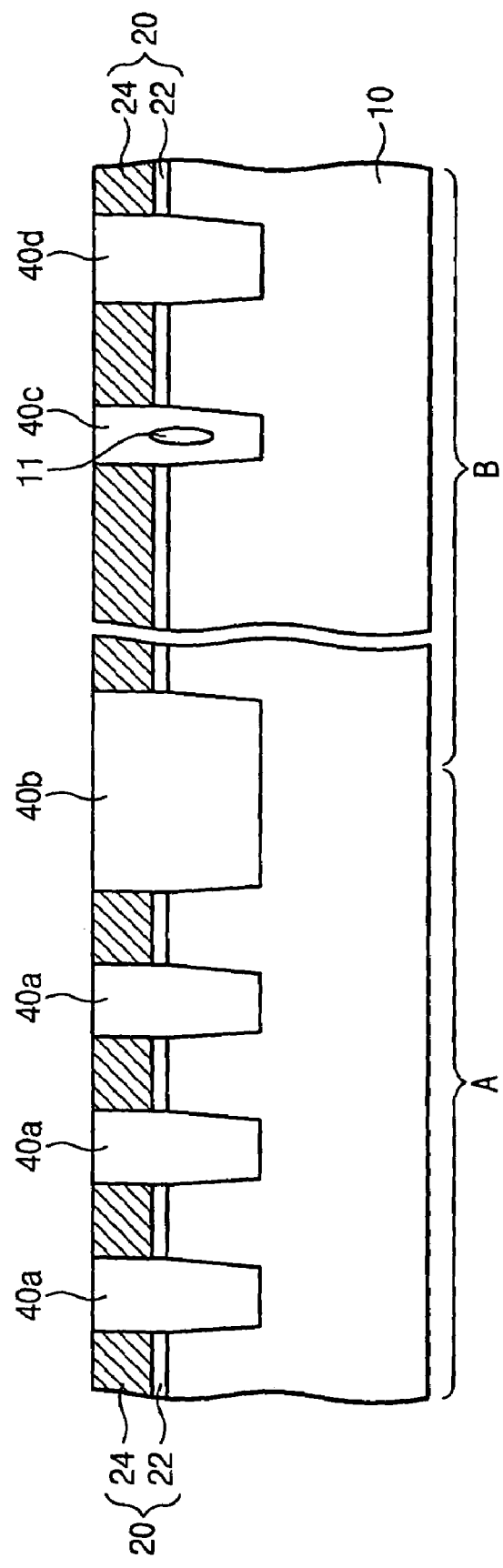
FIG. 1B is a cross-sectional view taken along a line I-I' of FIG. 1A and illustrating trench isolation layers formed using a conventional method.
Figure 1C:
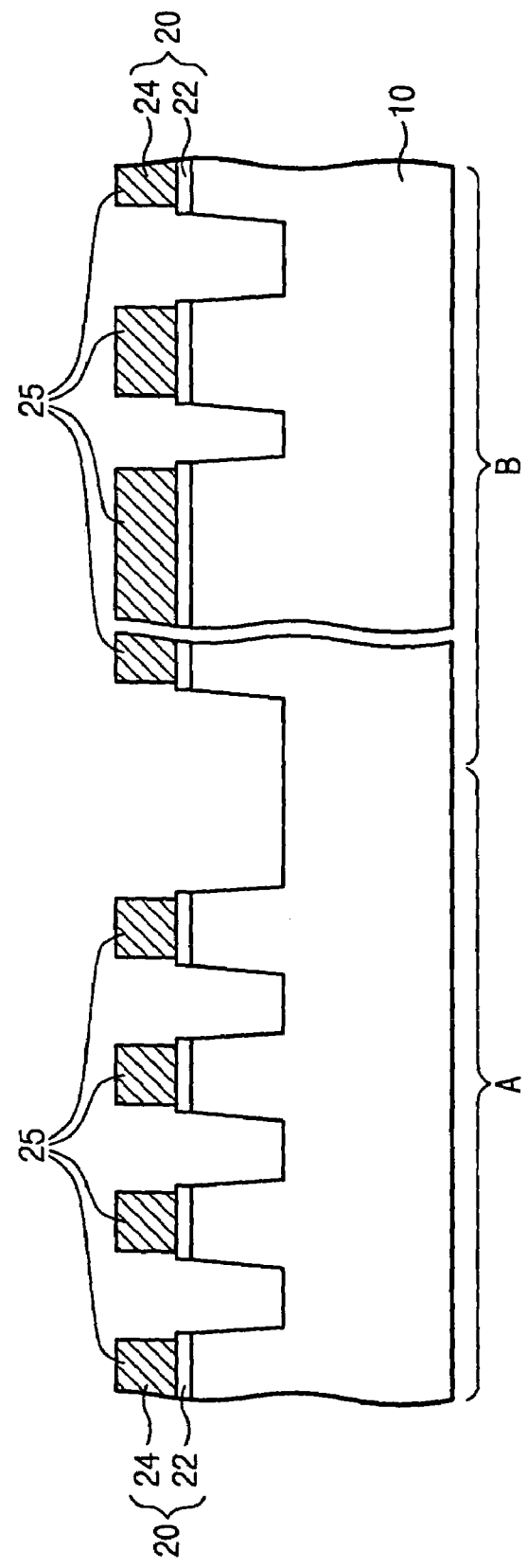
FIG. 1C is a cross-sectional view taken along a line I-I' of FIG. 1A and illustrating selective etching process performed on silicon nitride patterns; and, FIGS. 2 through 12 are cross-sectional views illustrating a method for fabricating a semiconductor device comprising device isolation layers in accordance with an embodiment of the invention.

As used herein, when a first element is referred to as being "on" a substrate or second element, the first element may be directly on the substrate or second element, or intervening elements may be present. In addition, terms such as "first," "second," "third," etc., are only used herein to distinguish between different elements, and these terms should not be construed as limiting the elements or regions described using them.

FIGS. 2 through 12 are cross-sectional views illustrating a method for fabricating a semiconductor device comprising device isolation layers in accordance with an embodiment of the invention. A flash memory device is an example of a semiconductor device that can be fabricated through the method illustrated in FIGS. 2 through 12, and the fabrication of a flash memory device will be explained with reference to FIGS. 2 through 12.

Referring to FIG. 2, a pad oxide layer (not shown) is formed on a P-type semiconductor substrate 110 (hereafter, semiconductor substrate 110) for an ion injection process. N-type impurity ions are injected into semiconductor substrate 110 to form a deep N-well 112 in a cell array region A using a photoresist pattern (not shown) as a mask. N-type impurity ions may be simultaneously injected into a region of a peripheral circuit region B. The region of peripheral circuit region B may be a high-voltage region of peripheral circuit region B. The pad oxide layer and the photoresist pattern for the ion injection process are then removed.

A first hard mask pattern 120 is then formed on semiconductor substrate 110 in which deep N-well 112 is formed. First hard mask pattern 120 comprises a first pad oxide pattern 122 and a first polish stopping pattern 124 stacked sequentially. First pad oxide pattern 122 may be formed from silicon oxide and first polish stopping pattern 124 may be formed from silicon nitride. Using first hard mask pattern 120 as an etching mask, semiconductor substrate 110 is then anisotropically etched. Thus, a plurality of first trenches 130 defining active regions are formed in peripheral circuit region B of semiconductor substrate 110. Simultaneously, a boundary first trench 130' can be formed on a boundary between cell array region A and peripheral circuit region B. Some or all of the trenches in the group of trenches comprising first trenches 130 and boundary first trench 130' can have different widths and also different depths. The widths and depths of the first trenches are determined in accordance with desired characteristics for electronic devices subsequently formed on semiconductor substrate 110.

First polish stopping pattern 124 comprises a plurality of segments 125, and a selective etching (i.e., a pull-back) process can be performed on each segment 125 of first polish stopping pattern 124. Semiconductor substrate 110, in which first trenches 130 and boundary first trench 130' are formed, is put into an etching solution, and sidewalls of each segment 125 of first polish stopping pattern 124 are thereby etched. Thus, the width of each segment 125 of first polish stopping pattern 124 is reduced. The etching solution may be an etching solution adapted to selectively etch first polish stopping pattern 124. For example, first polish stopping pattern 124 may be formed from silicon nitride, and thus the etching solution may be a phosphoric acid solution. Accordingly, gap-filling characteristics of peripheral circuit region B can be improved without negatively impacting line-type active regions of cell array region A, which have not yet been formed.

Referring to FIG. 3, a first oxide layer 142 and a first liner layer 144 are sequentially formed to cover sidewalls and bottoms of first trenches 130 and boundary first trench 130'. First oxide layer 142 may be formed through a thermal oxidation process. The thermal oxidation process may cure etching damage caused to sidewalls of first trenches 130 and boundary first trench 130' when they were being formed. First liner layer 144 may be silicon nitride ($Si_3N_4$) formed through a chemical vapor deposition (CVD) process, or silicon oxide nitride (SiON) formed through an additional oxidation process (i.e., through an oxidation process performed in addition to the CVD process). First liner layer 144 is conformally formed on the entire surface of first oxide layer 142 (i.e., a first thermal oxide layer). That is, first liner layer 144 is formed on the sidewalls and bottoms of first trenches 130 and boundary first trench 130', and thus first liner layer 144 prevents impurities of device isolation layer 140 (which will be formed subsequently) from penetrating into semiconductor substrate 110.

A first insulation material is then formed on semiconductor substrate 110, on which first liner layer 144 is formed, and fills the inside of first trenches 130 and first boundary trench 130'. Then, the first insulation material is planarized until first hard mask pattern 120 is exposed in order to form first device isolation layers 140 filling first trenches 130 and first boundary trench 130'. The first insulation material may be formed from a high-density plasma CVD oxide. The planarization may be performed using a chemical mechanical polishing (CMP) process having an etching selectivity with respect to first polish stopping pattern 124.

Figure 4:
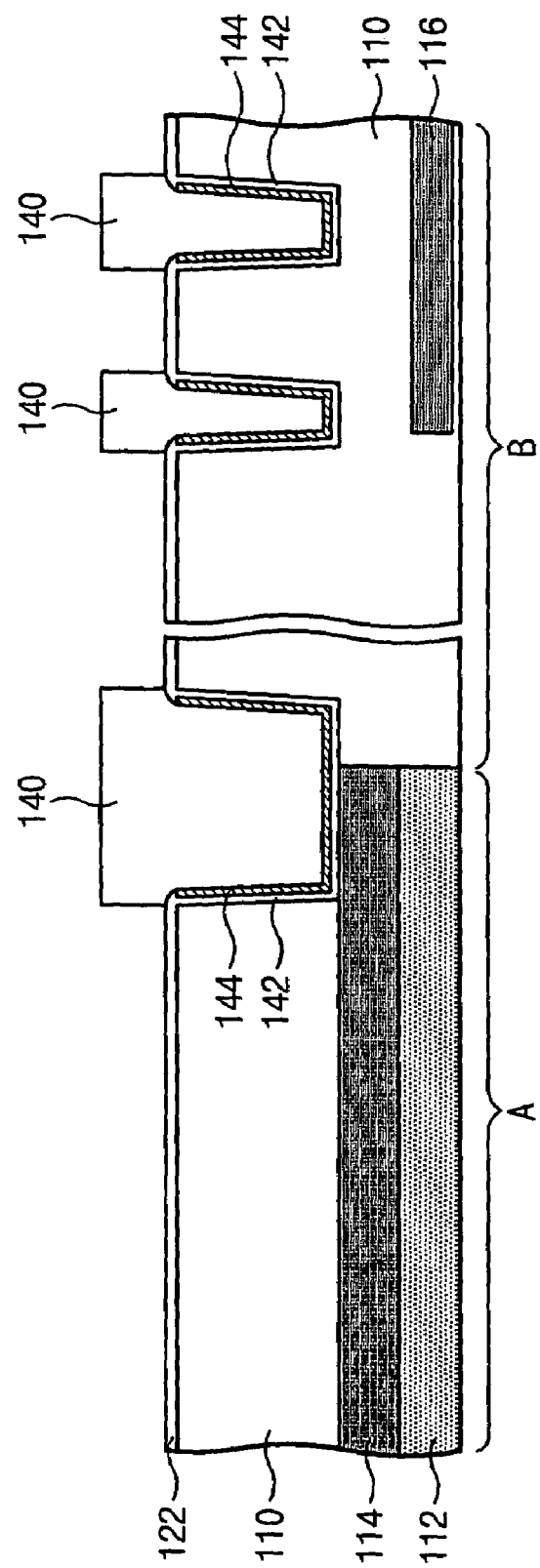

Referring to FIG. 4, first polish stopping pattern 124 is removed using a wet etching process to expose first pad oxide pattern 122. Using a photoresist (not shown) as a mask, P-type impurity ions are then injected into semiconductor substrate 110 to form a pocket P-well 114 on deep N-well 112 of cell array region A. Next, using another photoresist (not shown) as a mask, N-type impurity ions are injected into semiconductor substrate 110 to form a second N-well 116 in peripheral circuit region B. During forming the second N-well 116, an N-well can simultaneously be formed in cell array region A. Also, the order of the impurity ion injection processes used to form P-well 114 and second N-well 116 may be changed.

Figure 5:
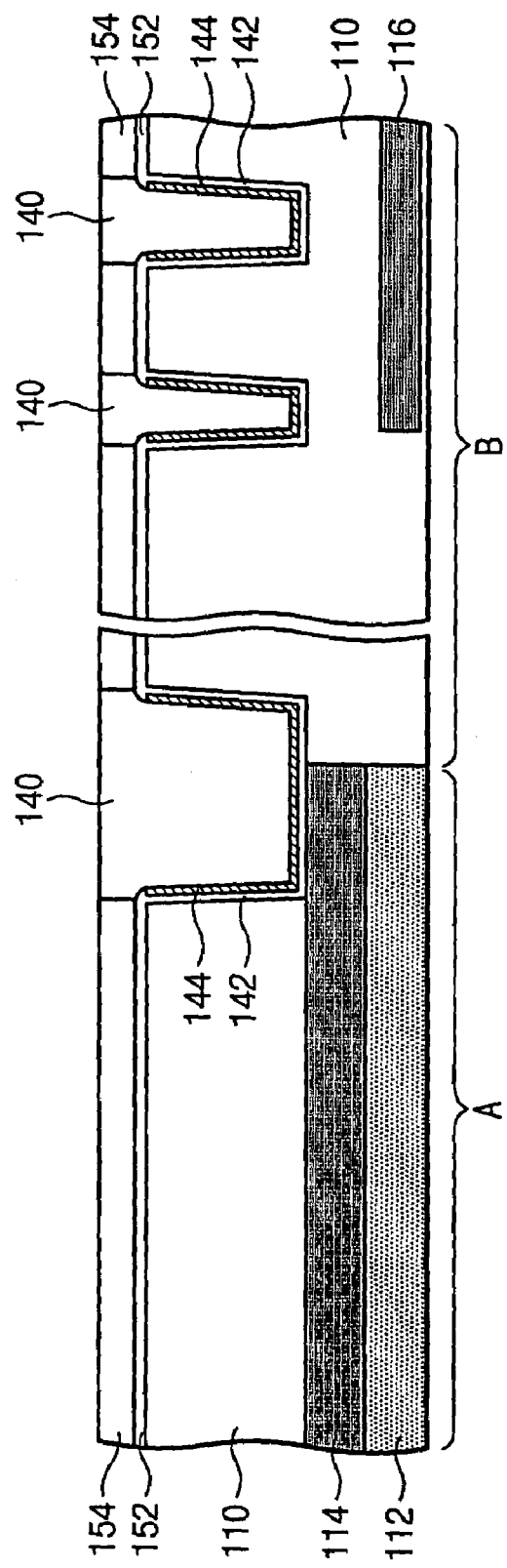

Referring to FIG. 5, semiconductor substrate 110 is exposed by removing the photoresist and first pad oxide pattern 122 from semiconductor substrate 110. A second pad oxide pattern 152 is then formed (i.e., another pad oxide layer is grown), and a polysilicon layer is formed on the surface of second pad oxide pattern 152. The polysilicon layer may then be planarized. The planarization of the polysilicon layer is performed using a CMP process having an etching selectivity with respect to first device isolation layers 140. Thus, a polysilicon pattern 154 is formed.

Figure 6:
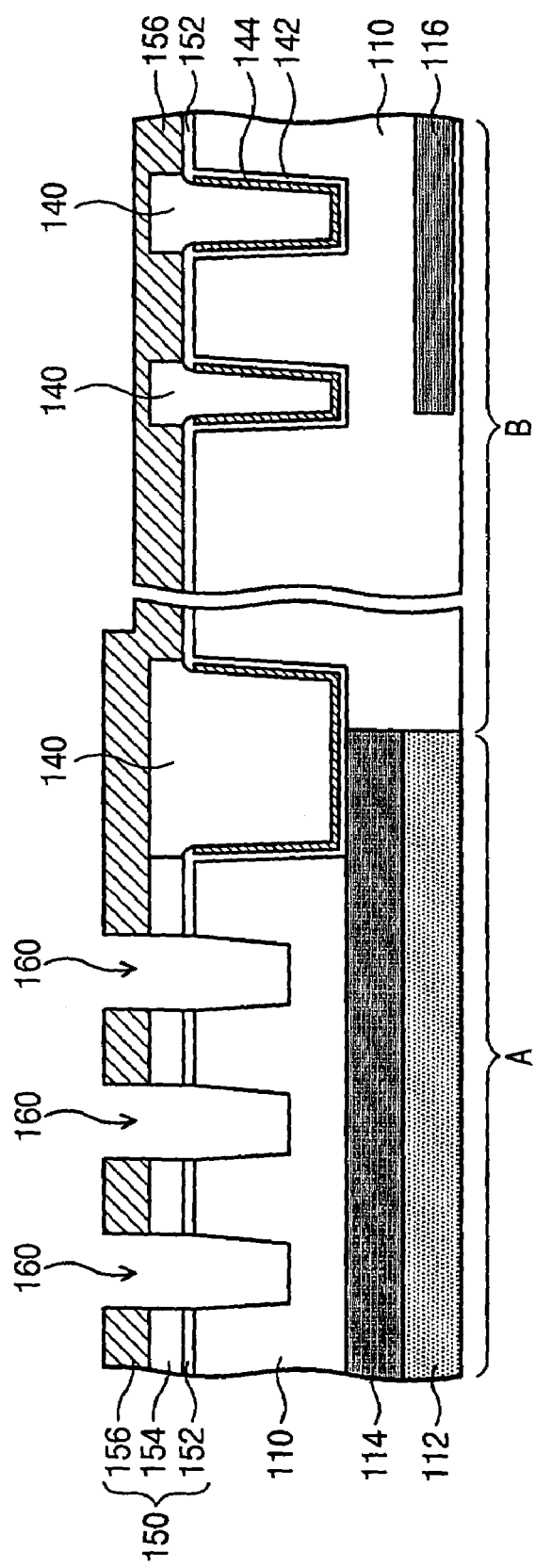

Referring to FIG. 6, a second polish stopping layer 156 is then formed on polysilicon pattern 154. Before the polish stopping layer is formed, the portion of polysilicon pattern 154 formed on peripheral circuit region B may be removed. In addition, the second polish stopping layer 156 may be a silicon nitride layer. A second hard mask pattern 150 is then formed, wherein second hard mask pattern 150 comprises second pad oxide pattern 152, polysilicon pattern 154, and a second polish stopping pattern 156 stacked sequentially. Second hard mask pattern 150 exposes portions of the surface of cell array region A of semiconductor substrate 110.

Using second hard mask pattern 150 as an etching mask, semiconductor substrate 110 is then anisotropically etched, thereby forming a plurality of second trenches 160 in cell array region A of semiconductor substrate 110. In addition, second trenches 160 define active regions. When the semiconductor device fabricated through the method illustrated with reference to FIGS. 2 through 12 is a flash memory device, second trenches 160, in which device isolation layers will be formed to isolate the active regions from one another, are also evenly spaced (i.e., uniformly disposed) since the line-type active regions of cell array region A are evenly spaced (i.e., regularly disposed). In addition, second trenches 160 may each have substantially the same depth. The aspect ratio of each second trench 160 may be smaller than the aspect ratio of at least some trenches of the group comprising first trenches 130 and boundary first trench 130', and the depth of each of second trenches 160 may be shallower than the depth of at least some trenches of the group comprising first trenches 130 and boundary first trench 130'.

Figure 7:
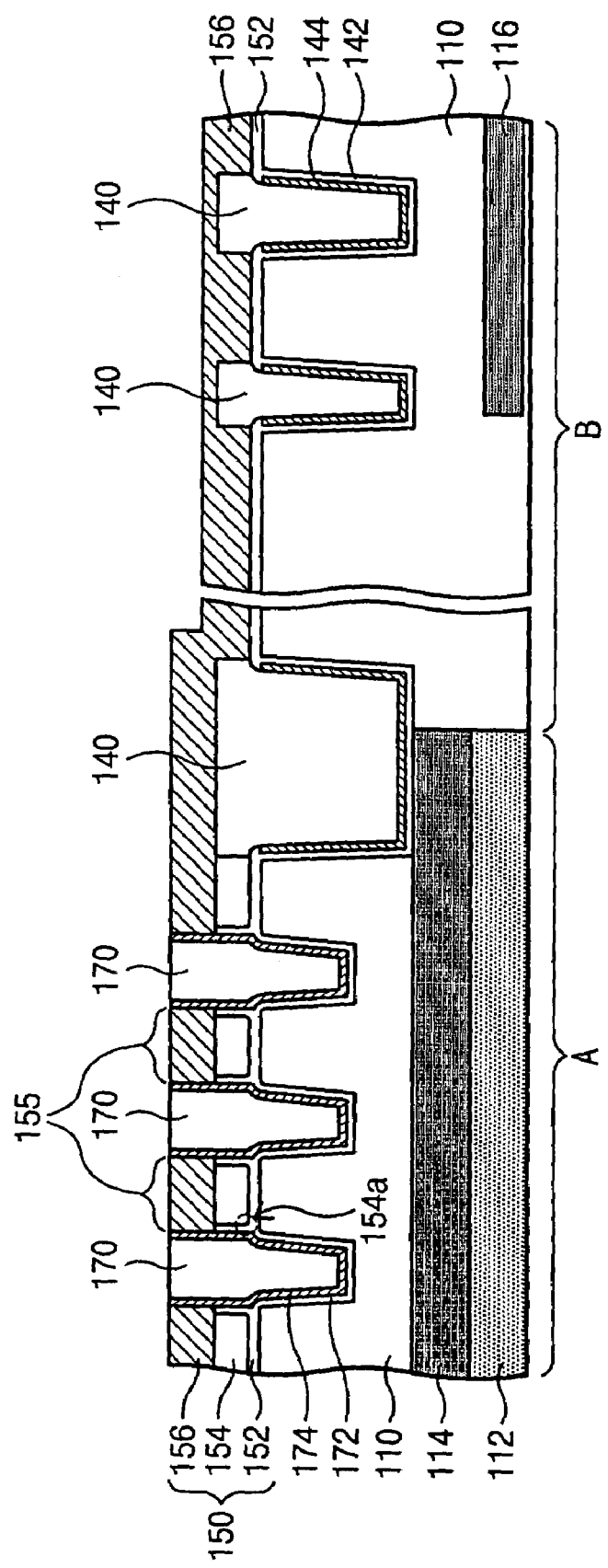

Referring to FIG. 7, a second oxide layer 172 and a second liner layer 174 are formed sequentially to cover sidewalls and bottoms of second trenches 160. Second oxide layer 172 may be formed through a thermal oxidation process. The thermal oxidation process may cure etching damage caused to sidewalls of second trenches 160 during the formation of second trenches 160. Simultaneously, that is, during the thermal etching process, the sidewalls of polysilicon pattern 154 are oxidized, and roundings 154a may be formed around edges of each polysilicon pattern 154. Each rounding 154a prevents the edge of a corresponding gate oxide layer (e.g., tunnel insulation layer 182 of FIG. 9). from being etched (i.e., recessed) by a subsequent wet etching process. Second liner layer 174 may be silicon nitride ($Si_3N_4$) formed through a CVD process, or silicon oxide nitride (SiON) formed through an additional oxidation process (i.e., through an oxidation process performed in addition to the CVD process). Second liner layer 174 is conformally formed on the entire surface of second oxide layer 172 (i.e., a second thermal oxide layer). That is, second liner layer 174 is formed on the sidewalls and bottoms of second trenches 160, and thus second liner layer 174 prevents impurities of device isolation layer 170 (which will be formed subsequently) from penetrating into semiconductor substrate 110.

Second oxide layer 172 and second liner layer 174 formed in second trenches 160 (i.e., on the sidewalls and bottoms of second trenches 160) may be thinner than first oxide layer 142 and first liner layer 144, respectively, which are formed in first trenches 130 and boundary first trench 130' since the pitch (with respect to the upper surface of semiconductor substrate 110) of the sidewalls of second trenches 160 of cell array region A may be less than the pitch of the sidewalls of first trenches 130 and boundary first trench 130'.

A second insulation material is then formed on semiconductor substrate 110 on which second liner layer 174 is formed, and the second insulation material fills second trenches 160. The second insulation material is different than the first insulation material. When the second insulation material is said to be different than the first insulation material, it means that one or more of the chemical and physical properties of the two materials such as the chemical formula, density, viscosity, compressive strength, electrical dielectric strength, etching speed, etc., are different.

The second isolation material is planarized until second hard mask pattern 150 is exposed in order to form second device isolation layers 170 filling second trenches 160. The second insulation material may be formed from an undoped silicate glass (USG) oxide. The planarization of the second isolation material may be performed using a CMP process having an etching selectivity with respect to polish stopping pattern 156. In addition, the portions of second hard mask pattern 150 disposed between adjacent second device isolation layers 170 will be referred to herein as first portions 155 of second hard mask pattern 150.

Figure 8:
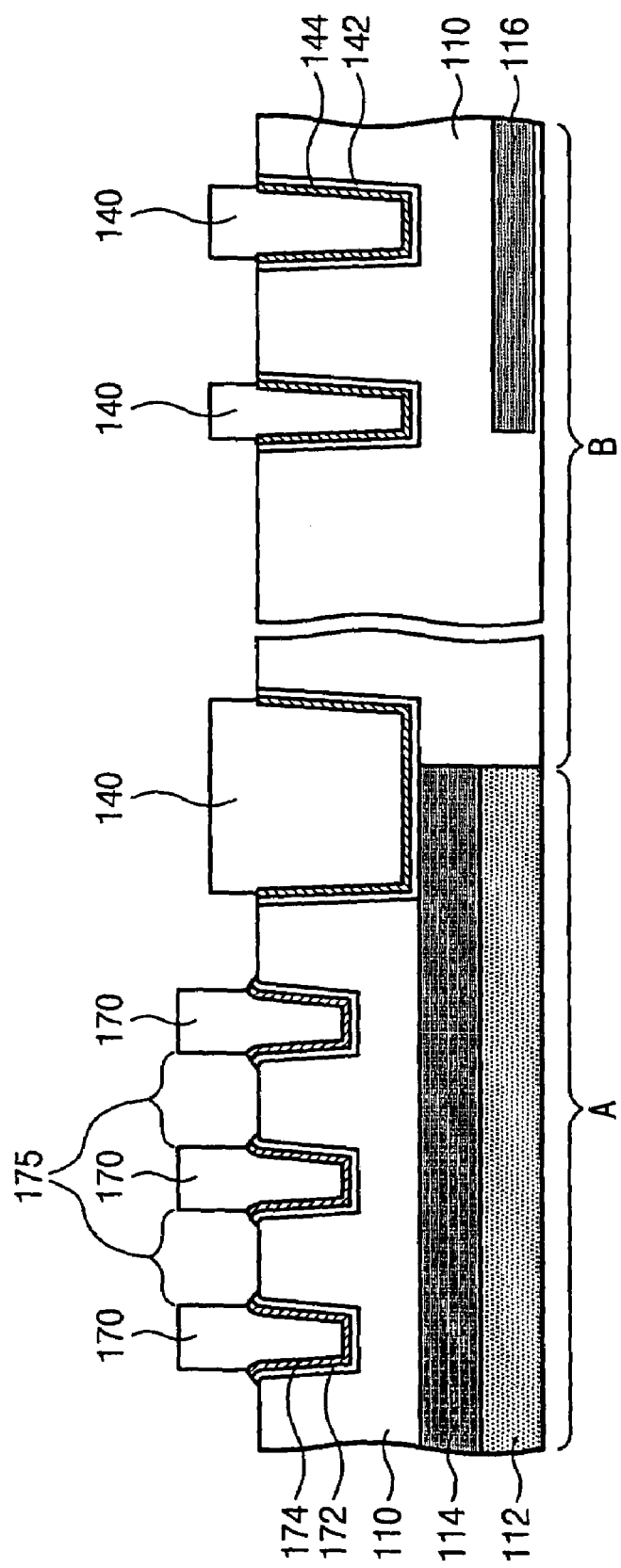

Referring to FIG. 8, polish stopping layer pattern 156, polysilicon pattern 154, and pad oxide pattern 152 are removed (i.e., second hard mask pattern 150 is removed) using a wet etching process in order to expose at least portions of the upper surface of semiconductor substrate 110. Thus, first and second device isolation layers 140 and 170 protrude from the upper surface of semiconductor substrate 110. Also during the previously mentioned wet etching process, upper sidewalls of first and second device isolation layers 140 and 170 are exposed and portions of the upper sidewalls of first and second isolation layers 140 and 170 are removed, thereby enlarging the width of the space between adjacent second isolation layers 170 to form floating gate gaps 175. That is, the distance between adjacent second device isolation layers 170, and thus the width of each floating gate gap 175, becomes larger than the width of each first portion 155 of second hard mask pattern 150 (see FIG. 7). Thus, as illustrated in FIG. 9, the width of each floating gate electrode 184, wherein each floating gate electrode 184 is formed between adjacent second device isolation layers 170 (i.e., formed in a respective floating gate gap 175), can be wider than if the upper sidewalls of second device isolation layers 170 were not etched.

Figure 9:
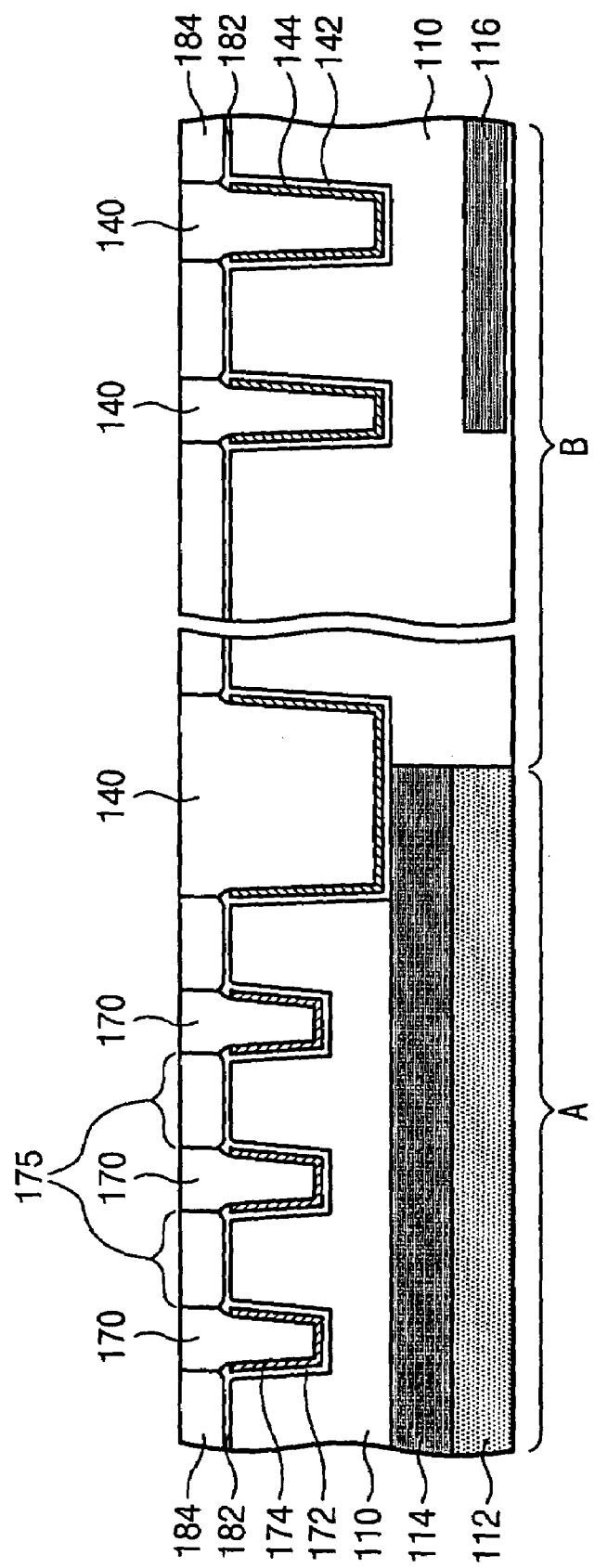

Referring to FIG. 9, a tunnel insulation layer 182 and a polysilicon layer are formed on the active regions of the exposed upper surface semiconductor substrate 110. Tunnel insulation layer 182 may be formed by thermally oxidizing the exposed upper surface of semiconductor substrate 110, and the polysilicon layer may be doped with impurity ions such as boron or phosphorus.

Then, the polysilicon layer is planarized until first and second device isolation layers 140 and 170 are exposed in order to form floating gate electrodes 184 that are self-aligned with second device isolation layers 170. The planarization may be performed using a CMP process having an etching selectivity with respect to first and second device isolation layers 140 and 170.

Figure 10:
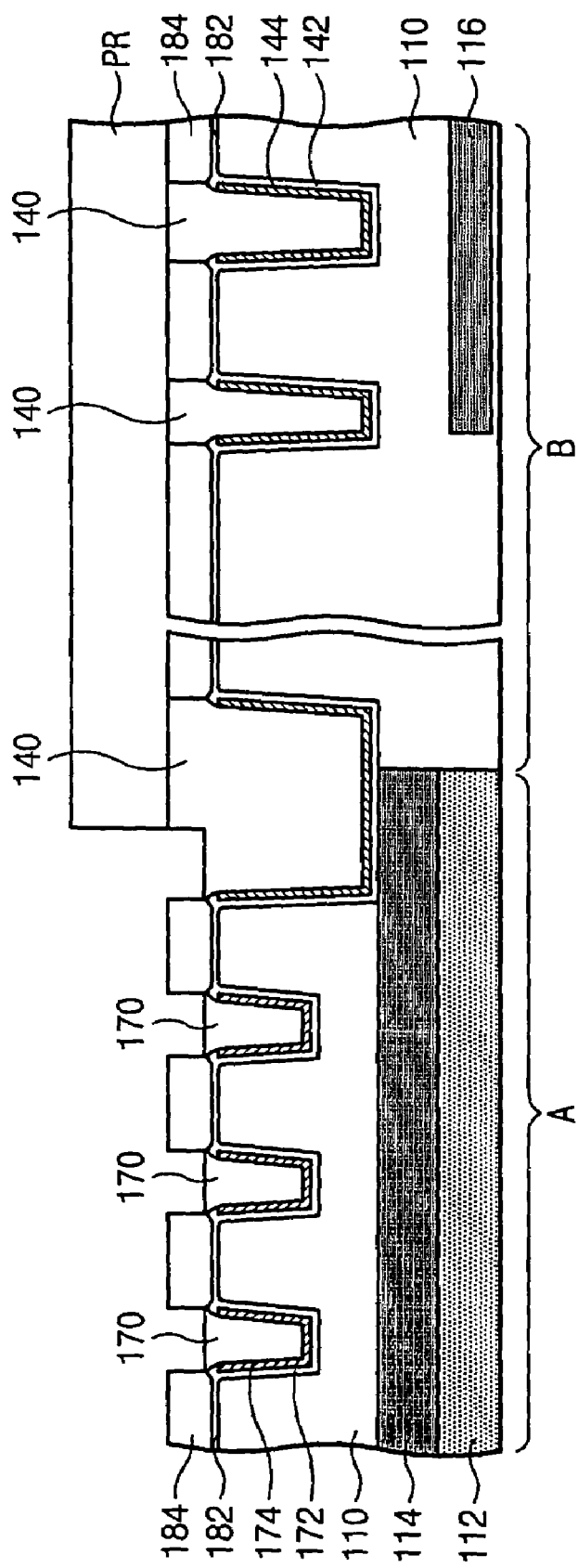

Referring to FIG. 10, an etching process is then performed using a photoresist pattern PR as an etching mask, and top portions of second device isolation layers 170 and a portion of a top portion of a least one first device isolation layer 140 is thereby removed. Second device isolation layers 170 disposed between floating gate electrodes 184 are etched (i.e., recessed) to expose sides of floating gate electrodes 184. Thus, the exposed surface area of each of floating gate electrodes 184 increases, so a coupling ratio between each floating gate electrode 184 and a control gate electrode (which will be formed subsequently) increases. In addition, since high-density plasma CVD oxide, from which first device isolation layers 140 are formed, may be etched at a lower rate compared to USG oxide, from which second device isolation layers 170 are formed, the first device isolation layer 140 formed on a boundary between cell array region A and peripheral circuit region B may not be etched as deeply as second device isolation layers 170 formed in cell array region A.

Alternatively, the top portions of first and second device isolation layers 140 and 170 can be etched (i.e., recessed) without using photoresist pattern PR. That is, first and second device isolation layers 140 and 170 may be etched simultaneously, and thus etched without a distinction between the device isolation layers of cell array region A and peripheral circuit region B.

Figure 11:
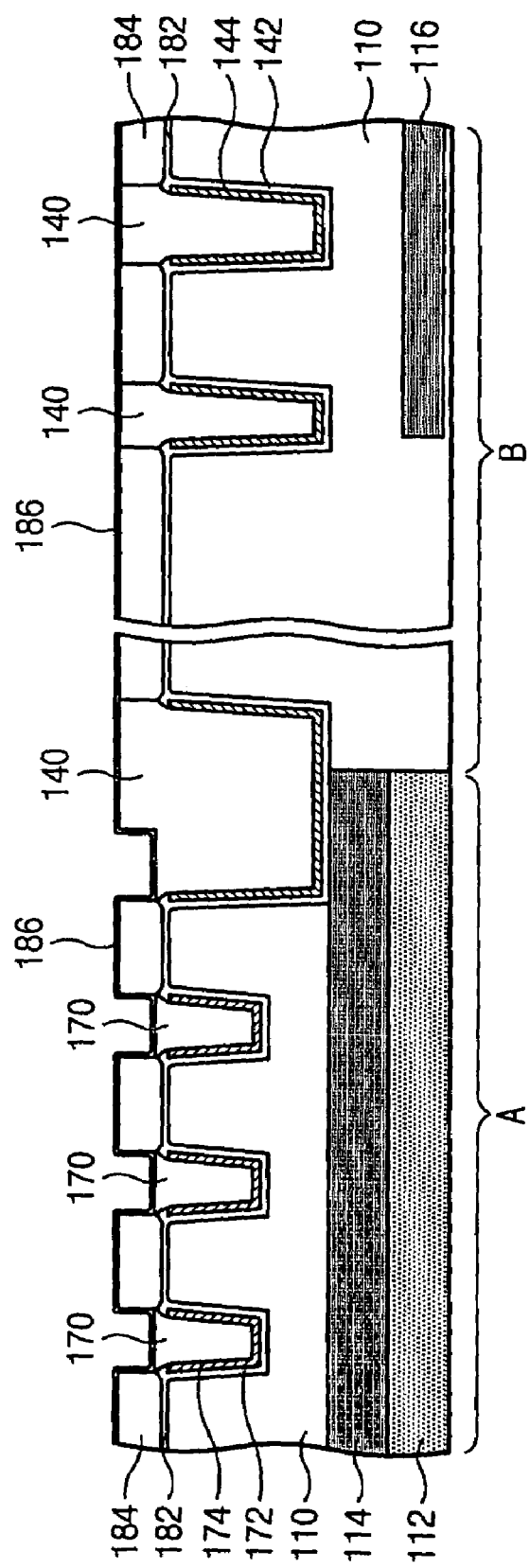

Referring to FIG. 11, an intergate dielectric layer 186 is formed on upper portions and sidewalls of floating gate electrodes 184. Intergate dielectric layer 186 may be an oxide-nitride-oxide (ONO) layer comprising silicon oxide, silicon nitride, and silicon oxide stacked sequentially.

Figure 12:
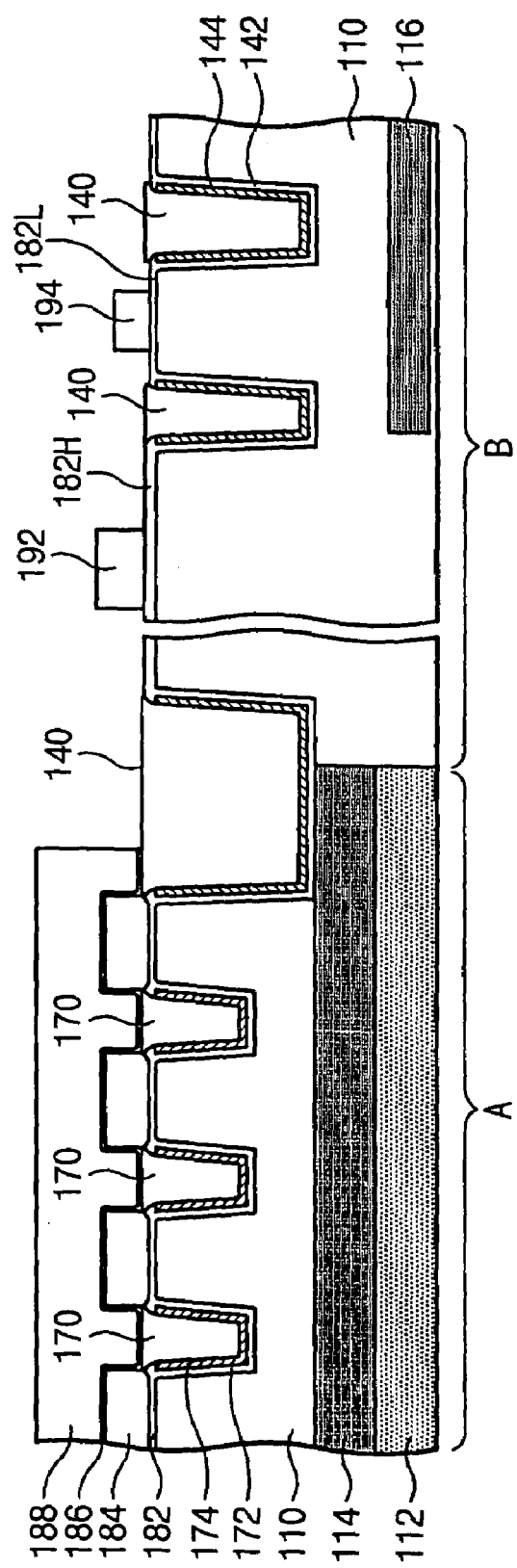

Referring to FIG. 12, using photoresist (not shown) as a mask, the top portions of first device isolation layers 140 disposed in the peripheral region B (and the remaining top portion of first device isolation layer 140 disposed in boundary first trench 130') are removed, and the portions of intergate dielectric layer 186, polysilicon layer 184, and tunnel insulation layer 182 formed in peripheral region B are removed to expose the upper surface of semiconductor substrate 110. After removing the photoresist, a high-voltage gate oxide layer 182H is formed on the exposed upper surface of semiconductor substrate 110 disposed in peripheral circuit region B. Using photoresist (not shown) exposing a low-voltage region of peripheral circuit region B as a mask, portions of high-voltage oxide layer 182H are removed to expose the portion of the upper surface of semiconductor substrate 110 disposed in the low-voltage region of peripheral circuit region B. After removing the photoresist, a low voltage gate oxide layer 182L is formed on the upper surface of semiconductor substrate 110 through a thermal oxidation process. The thermal oxidation process may also make high-voltage gate oxide layer 182H thicker.

A conductive layer is then sequentially formed and patterned to form a control gate electrode 188. The conductive layer comprises doped polysilicon or metal silicide. Thus, a gate structure is formed on cell array region A, wherein the gate structure comprises tunnel insulation layer 182, floating gate electrode 184, intergate dielectric layer 186, and control gate electrode 188 stacked sequentially. In addition, a high-voltage gate electrode 192 and a low-voltage gate electrode 194 are formed on peripheral circuit region B.

Impurity regions (not shown) are formed on both sides of the gate structure and high- and low-voltage gate electrodes 192 and 194 through an impurity ion injection process using the gate structure and high- and low-voltage gate electrodes 192 and 194 as a mask. Thus, a cell transistor is formed in cell array region A, a high-voltage transistor is formed in the high-voltage region of peripheral circuit region B, and a low-voltage transistor is formed in the low-voltage region of peripheral circuit region B.

In accordance with embodiments of the invention, the trenches and the device isolation layers that fill the trenches can be formed on cell array region A and peripheral circuit region B using different respective processes. The respective depths of the trenches formed in each of cell array region A and peripheral circuit region B may be different, and the respective etching profiles of the trenches may be independently controlled in accordance with a change(s) in the etching processes. Moreover, the respective thicknesses or layer qualities of first and second oxide layers 142 and 172 and first and second liner layers 144 and 174 may be adjusted to fit the characteristics of the respective regions among cell array region A and peripheral circuit region B in which they are formed.

For example, as illustrated in FIG. 7, since the pitch of trenches of cell array region A is less than the pitch of trenches of peripheral circuit B region, the thickness of second oxide layer 172 and second liner layer 174 disposed in cell array region A should be thinner than first oxide layer 142 and first liner layer 144 disposed in peripheral circuit region B, respectively. Also, to control the formation of roundings 154a formed through the thermal oxidation process performed on the trenches in cell array region A, processing conditions and a thermal processing time of the thermal oxidation process may be changed.

Additionally, in accordance with embodiments of the invention, by using polysilicon layer 154 between second pad oxide layer 152 and second polish stopping layer 156, the thinning of or the formation of a dent in the portion of the gate oxide layer disposed at an edge of the trench can be effectively reduced.

Moreover, since the process for selectively etching segments 125 of first polish stopping pattern 124 is performed independently from the process for forming device isolation layers 170 in cell array region A, and thus may be performed without affecting the active regions of cell array region A, variation in the threshold voltage Vt of the cell array transistor, which might be caused by the selective etching process if it were not performed separately from the process for forming device isolation layers 170, can be reduced.

In accordance with previously described embodiments of the invention, the conductivity type of semiconductor substrate 110 has been described as being P-type; however, semiconductor substrate 110 should not be construed as being limited to a conductivity type of P-type. Rather, in another embodiment, the conductivity type of semiconductor substrate 110 may be N-type. In embodiments in which semiconductor substrate 110 has an N-type conductivity type, N-type impurities are used where P-type impurities were used in the previously described embodiments, and P-type impurities are used where N-type were used in the previously described embodiments. Additionally, embodiments of the invention comprise performing the selective etching process for selectively etching segments 125 of first polish stopping pattern 124, but the selective etching (i.e., pull-back) process may be omitted.

In accordance with embodiments of the invention, device isolation layers may be formed in first trenches in the peripheral circuit region of the semiconductor device and in second trenches in the cell array region of the semiconductor device, wherein the second trenches have different aspect ratios than the first trenches, and the device isolation layers may be formed such that no void is formed in a device isolation layer, or such that a smaller void is formed.

Additionally, the device isolation layers of the cell array region and the peripheral circuit region can be formed using different respective processes, and also the device isolation layers can be formed to correspond to characteristics of the respective regions in which they are formed.

Moreover, since a process for forming trenches in the cell array region and the peripheral circuit region can be performed using different respective processes, problems such as the thinning of a portion of a gate oxide layer disposed at an edge of a trench of the cell array region, and variation in a threshold voltage of a cell transistor can be reduced, so characteristics of the cell array transistor may be improved.

Although embodiments of the invention have been described herein, it will be apparent to those skilled in the art that various modifications and variations can be made in the embodiments without departing from the scope of the invention as defined by the accompanying claims.

What is claimed is:

1. A method of fabricating a semiconductor device comprising:
    forming a first hard mask pattern on a semiconductor substrate;
    forming a plurality of first trenches having a first depth in a first region of the substrate by etching the substrate through the first hard mask pattern;
    filling the first trenches with a first insulation material to form first device isolation layers;
    removing the first hard mask pattern;
    forming a second hard mask pattern on the substrate after removing the first hard mask pattern, the second hard mask pattern covering the first device isolation layers;
    forming a plurality of second trenches having a second depth in a second region of the substrate by etching the substrate through the second hard mask pattern, wherein at least a portion of each of the second trenches is formed in a respective portion of the substrate that is covered by the first hard mask pattern while etching the substrate to form the first trenches; and,
    filling the second trenches with a second insulation material to form second device isolation layers.

2. The method of claim 1, wherein the first insulation material is a high-density plasma CVD oxide and the second insulation material is an undoped silicate glass (USG) oxide.

3. The method of claim 1, wherein at least one of the plurality of the first trenches has a larger aspect ratio than one of the plurality of second trenches.

4. The method of claim 1, wherein the first depth is different from the second depth.

5. The method of claim 1, wherein each of the second trenches has substantially the same width and substantially the same depth.

6. The method of claim 1, wherein the first region is a peripheral circuit region of the semiconductor device and the second region is a cell array region of the semiconductor device.

7. The method of claim 6, further comprising:
    forming a boundary first trench on a boundary between the cell array region and the peripheral circuit region while forming the first trenches; and,
    filling the boundary first trench with the first insulation material.

8. A method of fabricating a semiconductor device comprising:
    forming a plurality of first trenches in a peripheral region of a semiconductor substrate by etching the substrate using a first hard mask pattern, and filling the first trenches with a first insulation material to form first device isolation layers;
    removing the first hard mask pattern; and
    after removing the first hard mask pattern, forming a plurality of the second trenches in a cell array region of the substrate using a second hard mask pattern covering the first device isolation layers, and filling the second trenches with a second insulation material to form second device isolation layers,
    wherein at least a portion of each of the second trenches is formed in a respective portion of the substrate that is covered by the first hard mask pattern while etching the substrate to form the first trenches, and
    wherein the first device isolation layers are formed before forming the plurality of second trenches.

9. The method of claim 8, wherein the first hard mask pattern comprises a first pad oxide pattern and a first polish stopping pattern; and,
    the second hard mask pattern comprises a second pad oxide pattern, a polysilicon pattern, and a second polish stopping pattern.

10. The method of claim 9, wherein the first and second polish stopping patterns are each formed from silicon nitride.

11. The method of claim 10, wherein filling the first trenches with the first insulation material to form the first device isolation layers comprises:
    filling the first trenches with a high-density plasma CVD oxide layer after forming a first oxide layer and a first liner layer covering sidewalls and bottoms of the first trenches; and
    exposing the first hard mask pattern through a CMP process.

12. The method of claim 11, wherein filling the second trenches with the second insulation material to form the second device isolation layers comprises:
    filling the second trenches with an undoped silicate glass (USG) oxide layer after forming a second oxide layer and a second liner layer covering sidewalls and bottoms of the second trenches; and,
    exposing the second hard mask pattern through a CMP process.

13. The method of claim 12, wherein the second oxide layer is thinner than the first oxide layer and the second liner layer is thinner than the first liner layer.

14. The method of claim 12, further comprising removing a first portion of the polysilicon pattern of the second hard mask pattern, wherein the first portion of the polysilicon pattern is disposed on the peripheral circuit region.

15. The method of claim 12, further comprising:
    exposing at least portions of an upper surface of the semiconductor substrate and upper sidewalls of the first and second device isolation layers by removing the second hard mask pattern after forming the second device isolation layers; and,
    removing portions of the exposed upper sidewalls of the first and second device isolation layers through a wet etching process to form floating gate gaps between adjacent second device isolation layers, wherein the width of each floating gate gap is greater than the width of a first portion of the second hard mask pattern.

16. The method of claim 15, further comprising:
forming a tunnel insulation layer on the exposed portions of the upper surface of the semiconductor substrate; and,
forming a floating gate electrode on the tunnel insulation layer in one of the floating gate gaps disposed in the cell array region.

17. The method of claim 10, further comprising reducing the width of each one of a plurality of segments of the first polish stopping pattern by etching sidewalls of each segment of the first polish stopping pattern after forming the first trenches.

18. The method of claim 17, wherein etching sidewalls of each segment of the first polish stopping pattern comprises performing a wet etching process using a phosphoric acid solution.

19. A method of fabricating a semiconductor device, comprising:
forming a first hard mask pattern on a substrate, the first hard mask pattern comprising a first pad oxide pattern and a first polish stopping pattern;
forming first device isolation layers in a peripheral region of a substrate by etching the substrate through the first hard mask pattern to form first trenches and thereafter filling the first trenches with a first insulation material;
removing the first hand mask pattern;
forming a second hard mask pattern on the substrate and covering the first device isolation layers after removing the first hard mask pattern, the second hard mask pattern comprising a second pad oxide pattern, a polysilicon pattern, and a second polish stopping pattern;
forming second device isolation layers in a cell array region of the substrate by etching the substrate through the second hard mask pattern to form second trenches and thereafter filling the second trenches with a second insulation material, wherein at least a portion of each of the second trenches is formed in a respective portion of the substrate that is covered by the first hard mask pattern while etching the substrate to form the first trenches.

20. The method of claim 19, wherein filling the second trenches with the second insulation material comprises:
applying a thermal oxidization process to bottom and sidewall surfaces of the second trenches to form an oxide layer, wherein the thermal oxidation process rounds corner edges of the polysilicon pattern; and
forming a liner layer on the oxide layer before filling the second trenches with the second insulation material.

21. The method of claim 20, further comprising:
removing the second hard mask pattern, wherein the second hard mask pattern comprises a first portion of the second hard mask pattern separating adjacent second device isolation layers, and
sidewall surfaces of the second insulation material are etched during removal of the first portion of the second hard mask pattern to form floating gate gaps wider than the first portion of the second hard mask pattern.

22. The method of claim 21, further comprising:
forming a tunnel insulating layer on the floating gate gaps;
forming floating gate electrodes on the tunnel insulating layer over the tunnel insulating layer;
forming an inter-gate dielectric layer over the floating gate electrodes; and
forming a control gate on the inter-gate dielectric layer and the floating gate electrodes.

* * * * *